US009087848B2

(12) United States Patent
Leontiev et al.

(10) Patent No.: US 9,087,848 B2
(45) Date of Patent: Jul. 21, 2015

(54) DEVICE FOR STORING AND PROCESSING INFORMATION (SPI DEVICE)

(76) Inventors: Vladimir Vasilievich Leontiev, Saint Petersburg (RU); Sergey Vladimirovich Leontiev, Saint Petersburg (RU)

(*) Notice: Subject to any disclaimer, the term of this patent is extended or adjusted under 35 U.S.C. 154(b) by 487 days.

(21) Appl. No.: 13/459,113

(22) Filed: Apr. 28, 2012

(65) Prior Publication Data

US 2012/0268886 A1    Oct. 25, 2012

Related U.S. Application Data

(63) Continuation-in-part of application No. PCT/RU2009/000599, filed on Nov. 2, 2009.

(51) Int. Cl.
| | |
|---|---|
| H05K 7/00 | (2006.01) |
| G06K 19/06 | (2006.01) |
| H01L 23/552 | (2006.01) |
| G06K 19/077 | (2006.01) |

(52) U.S. Cl.
CPC ........ *H01L 23/552* (2013.01); *G06K 19/07749* (2013.01)

(58) Field of Classification Search
CPC ............. H05K 5/06; H05K 7/02; H05K 7/04; G06K 19/18; G06K 19/07749
USPC ............ 361/679.31, 704, 713, 715, 747, 814; 174/520
See application file for complete search history.

(56) References Cited

U.S. PATENT DOCUMENTS

| | | | |
|---|---|---|---|
| 2003/0020182 A1 | 1/2003 | Blanc et al. | |
| 2004/0061994 A1* | 4/2004 | Kerr et al. | 361/679 |
| 2005/0162331 A1* | 7/2005 | Endo et al. | 343/788 |

(Continued)

FOREIGN PATENT DOCUMENTS

| | | | | |
|---|---|---|---|---|
| RU | 2133502 | * | 7/1999 | G06K 19/18 |
| RU | 2190251 | * | 9/2002 | G06K 19/18 |

OTHER PUBLICATIONS

RU 2133502, Title: Data Storage and Processing Device, Auther: Leont Ev Vladimir Vasil Evich Priority No(s). RU19960111153 19960604; Date;Jul. 20, 1999, Publisher: Espacenet English translation (Machine) Date Jul. 21, 2014.*

(Continued)

*Primary Examiner* — Jayprakash N Gandhi
*Assistant Examiner* — Mukund G Patel

(57) ABSTRACT

The invention relates to a device for storing and processing information (SPI device) comprising a sealed protective casing produced from conductive non-magnetic material, and a unit for storing and processing information, the unit comprising a base, a logic board, communication boards, magnetic cores and electrical coupling components which are combined into an electrical circuit of the stand-alone unit for storing and processing information, and can be used in the field of radio electronics, computation, informatics, and telecommunications as a portable integrated solid-state device which is provided with a contactless input of electrical energy and information signals from another electrical energy apparatus. An achieved technical result is in wider applicability of the SPI device, increased protection of information, and improved characteristics, such as resistance to environmental impacts, higher operating speed, reliability, and multifunctional performance, improvement of mass-dimensional properties and production processability index.

14 Claims, 5 Drawing Sheets

(56) References Cited

U.S. PATENT DOCUMENTS

2008/0309507 A1* 12/2008 Anderson et al. ............. 340/679
2009/0019411 A1* 1/2009 Chandra et al. ................... 716/9
2009/0075056 A1* 3/2009 Iwamoto et al. ........... 428/319.1

OTHER PUBLICATIONS

RU 2133502, Title: Apparatus for Storing and Processing Data, Auther: Leont Ev Vladimir Vasil Evich Priority No.(sRU20000106785 20000321; Date;Sep. 27, 2002, Publisher: Espacenet English translation (Machine) Date Jul. 21, 2014.*

* cited by examiner

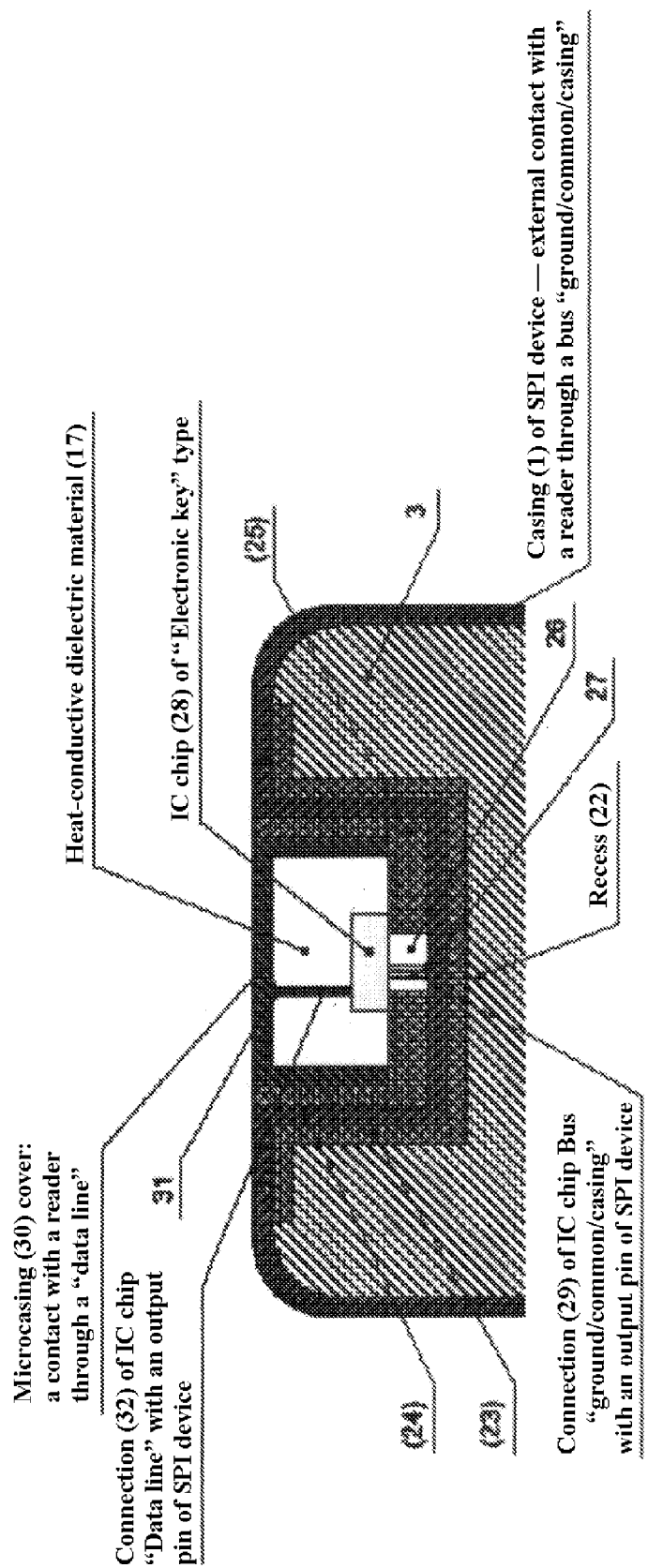

DEVICE FOR STORING AND PROCESSING INFORMATION (SPI DEVICE)

CROSS-REFERENCE TO RELATED APPLICATION

This application is a continuation-in-part of International Application PCT/RU2009/000599 filed on Nov. 2, 2009. The content of this application is hereby incorporated by reference in its entirety.

TECHNICAL FIELD

The invention relates to radio electronics, computation, informatics, and telecommunications and can be used as a portable integrated solid-state device which is provided with a contactless input of electrical energy and information signals from another electrical energy apparatus. The device is intended for storing and processing short-term, long-term, private, corporative, and other information data.

BACKGROUND OF THE INVENTION

An achieved technical result is in wider applicability of the SPI device, increased protection of information, and improved characteristics, such as resistance to environmental impacts, higher operating speed, reliability, and multifunctional performance, improvement of mass-dimensional properties and production processability index. The result is achieved by the following: the SPI device Comprises a protective casing and "n" data exchange working planes which where "n" corresponds to the number of communications boards; the unit for storing and processing information (SPI unit) comprises at least one logic board having a switching board and frameless (microcasing) active and passive radio components mounted thereon and combined through a conductor layout of the switching board according to the schematic circuit diagram; and one communication board, each having communication coils being secondary coils of a planar transformer formed when the device for storing and processing information is installed into a device for reading/writing, the at least one communication coil is a power supply channel communication coil and the other coils are information channel communication coils wherein conductive elements of the communication board switching systems are electrically isolated from the protective casing, magnetic core, base, and from the switching layers of the switching board of logic board, one magnetic core produced from thin-layer magnetic conducting material, provided between a base and a communication board, and/or between a logic board and a communication board respectively, the magnetic core is parallel with one surface and adjacent to the surface switching layers of a communication board and electrically isolated from the said switching layers, base material, switching layers of a logic board, wherein switching layers of the logic board switching board are electrically isolated from the base material, magnetic core, and casing material and microelectronic units and radio components are installed on the logic board on the base side, and the electrical coupling components combine the electrical circuit of the logical board and the electrical circuits of the communication boards, and the magnetic cores into a general electrical circuit of the unit for storing and processing information.

FR 2624284 "Carte comportant un composant electronique" (published on 16 Sep. 1989, G06K 19/077) discloses a module comprising electronic components and a base having cells filled with a viscous shockproof medium. The electronic components are placed into the cells and connected with a common board. The module further comprises a loop to provide an electrical connection with the electronic components. Said device has a certain degree of vibration resistance, but it does not have protection against adverse environmental impacts.

SU 1451880 (published on 15 Jan. 1989, H05K 5/06) "Sealed Casing", RU 2046397 (published on 20 Jun. 1995, G06K 19/12) "Device for Storing and Processing Information", and RU 2190251 (published on 27 Sep. 2002, G06K 19/18, H05K 7/02) "Device for Storing and Processing Information" disclose a logic board, specifically a multichip module, and microelectronic units, a base with, if required, stiffener ribs and apertures (grooves) in the base, filling material specifically a heat conducting shock-absorbing dielectric material, connecting elements, sealed casing, communication board to provide communication with coupling coils.

Other devices are known, wherein protection against a corrosion and explosion can be used in the other known devices along improved vibration resistance of a module, circuit density and usability.

However, the known devices have certain limitations. For example, SU 1451880 provides a complex combination of specific construction elements and various materials, specifically dielectrics and metal alloys, for sealing a casing, thus significantly decreasing protection of radio components and switchability in said sealed devices from the impact of adverse environment, such as water and matters dissolved in the water, and protection from electromagnetic radiation because casing structure is inhomogeneous, thus resulting in decreased reliability and lasting properties. RU 2190251 provides a complex multilevel sealing system used to contactlessly exchange data, wherein the system is not suitable for portable devices due to its mass-dimensional properties, but it is suitable for the portable, stationary and on-board equipment of complex systems. RU 2046397 provides a device for contactless data exchange, comprising a casing having a bottom provided with an aperture, wherein an insert of alumina ceramics based radio transparent material is placed in the aperture, thus lowering reliability of the device in conditions of mechanic, climatic, and electromagnetic impacts due to inhomogeneity of materials used in the construction, particularly due to low conductivity of the insert material, low mechanical stability of alumina ceramics to vibration and shock loads, and further due to low stability of the construction comprised of various materials to heat shocks caused by a variation in linear expansion factor.

The closest prior art is RU 2133502 (published on 20 Jul. 1999, G06K 19/18, H05K 7/02) "Device for Storing and Processing Information". RU 2133502 provides a device in the form of a module comprising: a first printed board bearing electronic units connected into microelectronical circuit; information (receive/transmit) coils and electrical power coils; a second multilayer board; a first membrane; a metal base; an outer sealed casing receiving the base, loop, and viscous dielectric material; a third multilayer board, an inner bearing metal casing and a second membrane are used, wherein the information (receiver/transmit) coils and the first membrane are provided on the second multilayer board, while the electrical power coils and the second membrane are provided on the third multilayer board, wherein the second and the third boards are provided on the opposite sides of the base, while the information coils and the electrical power coils are electrically connected with the electronic units through the loop, wherein the first board is provided in the inner bearing casing mounted in the base between the third and the second multilayer board, wherein the space between walls of the inner bearing casing, the first board and the electronic units is filled with viscous dielectric material, and the outer sealed casing is provided as an all-metal casing with apertures used for passing the loop.

Disadvantages of the device are limited applicability, insufficient speed of short-time authentication and identification of subjects and objects, insufficient operational reliability under mechanical loads and electromagnetic radiation, ineffective heat transfer from thermally loaded electronic units, insufficient performance speed, inefficient usage of the device volume, low processability index for manufacturing certain construction elements and device assembly, low maintenance ability, high metal and energy consumption that are caused by the following:

1. Printed boards are provided on the metal base with coils of the printed boards, the coils being oriented inwards from the outer casing walls causing a bigger clearance between coils of the SPI device and coils of the external device for recording and/or reading information, thus lowering resistance to electromagnetic radiation, performance index, and information exchange speed and increasing costs for electrical power energy.

2. A distance for interaction of the SPI device with external devices for reading/recording data is limited, the distance being necessary to enable operation of some user systems, such as e.g. watchdog or gating systems or similar.

3. The inner metal casing is installed in the metal base.

4. A complex structure of the inner metal casing requires large costs for its precise manufacturing.

5. The inner metal casing comprising the printed board with the electronic units is formed as a box, thus hindering access for performing on-the-fly debugging of device during bench tests, preliminary tests, and acceptance tests, hindering required correction of defects in radio components, and electronic units, and soldering.

6. Stiffener ribs on the bearing surface of the inner metal casing are absent, thus lowering resistability to mechanical loads.

7. A clearance between surface of the heat-loaded electronic units and adjacent surface of the inner metal casing is wide.

8. There is a technological clearance between the inner bearing metal casing and the metal base.

An achieved technical result is in wider applicability of the SPI device, increased protection of information and improved characteristics, such as resistance to environmental impacts, higher operating speed, reliability, and multifunctional performance, improvement of mass-dimensional properties and production processability index.

BRIEF SUMMARY OF THE INVENTION

The technical result is achieved due to the device for storing and processing information (SPI device) comprising a sealed protective casing of conductive non-magnetic material, and a unit for storing and processing information (SPI unit), the SPI unit comprising a base, a logic board placed on the base including a switching board with switching layers, microelectronic units and radio components which are combined into an electrical circuit, communication boards having communication coils and switching layers, wherein communication coils are installed on outer sides of the SPI unit working planes, magnetic cores and electrical coupling components which are combined into an electrical circuit of the stand-alone unit for storing and processing information (SPI unit).

The device is characterized in that the protective casing has "n" data exchange working planes where "n" corresponds to the number of the communications boards in the unit for storing and processing information (SPI unit) which is a stand-alone unit and comprises at least one logic board, specifically a multichip module, and single communication board each having communication coils being secondary coils of a planar transformer formed when the SPI device is installed into a device for reading/writing, wherein at least one of the communication coil is a power supply channel communication coil, while the other of the communication coils are information channel communication coils;

wherein conductive elements of Communication boards are electrically isolated from the magnetic core, the protective casing, and the base, wherein input/output contact members of the communication coils of each of the communication board are connected with the electrical circuit components of the logic board by means of the electrical coupling components;

one magnetic core of a thin-layer magnetic conducting material, the magnetic core being provided between the base and the communication board and/or between the logic board and the communication board, respectively, wherein the magnetic core is parallel with one surface and adjacent to the surface switching layers of the communication board and electrically isolated from said switching layers, the base material, the switching layers of the logic board, wherein the switching layers of the logic board switching board are electrically isolated from the base material, the magnetic core, and the casing material and the microelectronic units and the radio components are installed on the logic board on the base side, and the electrical coupling components combine the electrical circuit of the logical board, the electrical circuits of the communication boards, and the magnetic cores into a general electrical circuit of the SPI unit.

In addition, the SPI device can be implemented as a combination of at least one microchip modules (logic boards) and a corresponding number of communication boards, magnetic cores, electrical coupling components and bases. The protective casing can be provided with at least one recess in the working plane wherein an insert of a dielectric material is installed in a plane of the at least one recess, the front side of the protective casing is provided with graphic information and/or an optical carrier, and/or a magnetic carrier, and/or another information medium compatible with dielectric plane of the insert and/or the material of the casing, said data mediums or other data mediums can be provided directly in the casing recess. Moreover, graphic information can be applied directly on the protective casing material. In addition, the inserts can be provided with at least one microchip having active and passive radio components and an antenna. The inserts can be inserted into the recess after the SPI device is installed in the protective casing. Sealing of the SPI device is performed by creating a conductive vacuum-tight seam on the periphery mated part of the casing. The casing can comprise at least one element of a homogeneous material.

The communication board coils can be in the form of inductance coils. The logic board and microelectronic units (MEU) can comprise semiconductor devices (SCD), passive radio components (REC), and heat sinks. MEU, SCD, and other REC can be provided on one side or both sides of the switching board of the logic board. In this case, microelectronic units and SCD can be selectively provided with heat sinks. Said heat sinks can be electrically isolated from the base, switching layers of the logic board, microelectronic units, SCD and radio components, and can have a heat link with a base through heat-conductive dielectric material filling in the space between the base and the heat sink. The logic board is provided on the base so that the microelectronic units and the radio components are faced towards the space between stiffener ribs of the base. The space between the logic board components and a base is filled with a heat conductive damping dielectric material. The heat sinks can be implemented with a heat link. Moreover, the magnetic core is installed adjacent to the logic board and/or base and divided into at least two magnetic cores, the at least two magnetic cores being installed adjacent and parallel to switching layers of the communication boards and corresponding communication coils. The magnetic core can comprise at least one layer of conductive magnetic material. The magnetic core corresponding to power supply channel communication coils is electrically isolated from the magnetic core corresponding to information channel communication coils. Additionally, the SPI unit can be provided with a common bus electrically connecting with the magnetic core, and also comprises at least one logic board each comprising a switching board with the microelectronic units of the switching board, SCD, other radio components and heat sinks, if required. The base is provided with stiffener ribs from one or both sides of the base bearing surface. The base is also provided with at least one groove and/or drilling along the periphery of the end surface in order to lock the sealing casing mechanically. Grooves in the base are closed on the periphery of the end surfaces. The base is provided with recesses and drillings for placing microcasings comprising identification chip (for example, the chip used in the electronic key series iButton, Dallas Semiconductor), said microcasing is constructed from the same kind of material as the casing and is connected to the casing with vacuum-tight seam. The microcasing can be directly incorporated into the protective casing element. At least one identification chip comprising a single-wire port, a logical control unit and a storage device can be installed into the base recesses situated on the end surfaces of the base. A series of identification chips each comprising a real-time clock, sensor devices (sensors), a cryptomicroprocessor, a digital wallet and others can be installed into the base recesses situated on the end surfaces of the base. The base can be in the form of a composite base, wherein the parts of the base are connected by mechanical fasteners or conductive glue, for example conductive adhesive (glue), and also by ultrasonic spot welding or other methods providing maintenance ability, ultrasonic welding or other methods which provide a reliable conductive mechanical junction when the logic boards are placed on the parts. The number of the base parts can be less or equal to the number of logic boards. The composite bases comprise recesses, wherein communications boards and corresponding magnetic cores are installed on end surfaces of the recesses. The electrical coupling components can connect the magnetic core with the common bus of the SPI unit. The electrical coupling components can pass through apertures or grooves in the base. The electrical coupling components can be implemented as loops, plug wires, or other connective means. The communication boards and the magnetic cores can be positioned both orthogonal and with the angle $\alpha \neq 90°$ to the logic board, and can be fixed on end surfaces of both one-piece and composite bases. Moreover, magnetic cores integrated into assembly units of the SPI unit can be positioned at the same level (one layer).

BRIEF DESCRIPTION OF THE DRAWINGS

The technical solution is illustrated by the drawings:

FIG. 2 shows possible ways of mounting logic boards, magnetic cores and communication boards on the SPI unit bases, wherein dielectric materials are not shown.

FIG. 7 is a construction diagram illustrating an identification chip position in a SPI device.

DETAILED DESCRIPTION OF THE INVENTION

Figure 1:
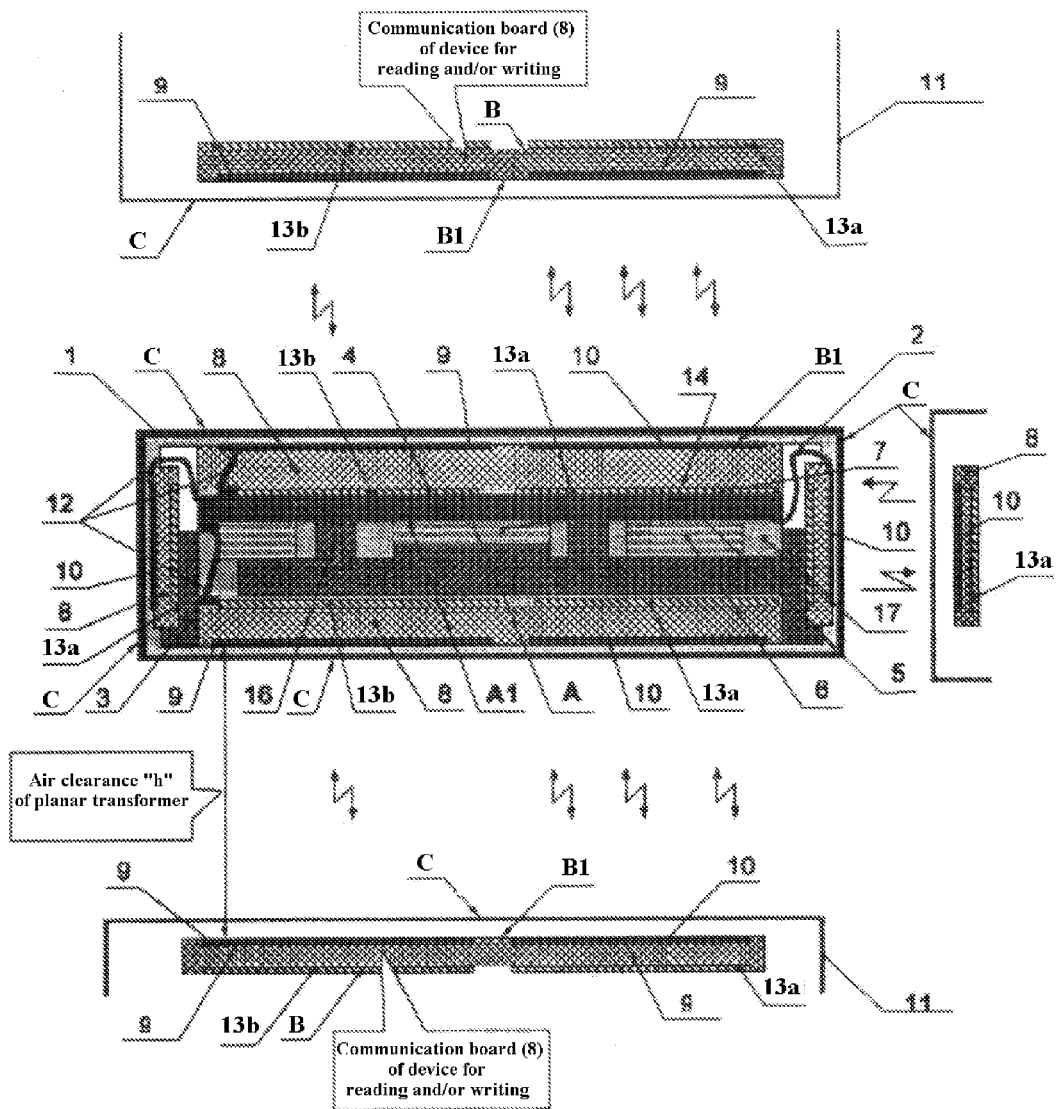
FIG. 1 shows a SPI device comprised of a SPI unit having 4 communication boards and 3 devices for reading/writing, wherein the SPI device comprises n assembly units (AU), where n≥1, and the height of the AU package h1≥5 mm, and recesses are provided in sides of the composite SPI device, the recesses being used for mounting additional AU comprising communication boards and magnetic cores. Communication coils are positioned adjacent to a protective casing.
Figure 2A:
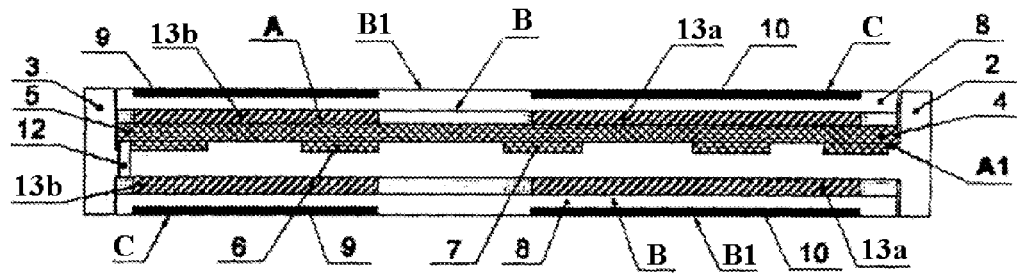
FIG. 2a shows a SPI unit which is an assembly of two assembly units (AU). One of the assemble units comprises logic board, communication board and the magnetic core (batch of magnetic cores) provided between them, the other assembly unit comprises a communication board and a magnetic core (batch of magnetic cores). Assembly units are mounted on both sides of the base and communication coils are placed adjacently to the casing (not shown).
Figure 2B:
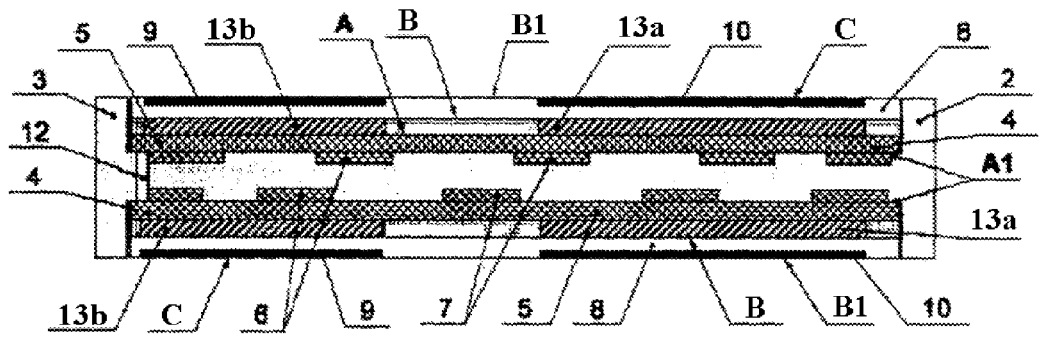
FIG. 2b shows SPI unit, which is an assembly of two assemble units (AU). Each one of the assembly units comprises a logic board, a communication board, a magnetic core (batch of magnetic cores) provided between the logic board and the communication board and communication coils are placed adjacently to the casing (not shown).
Figure 2C:
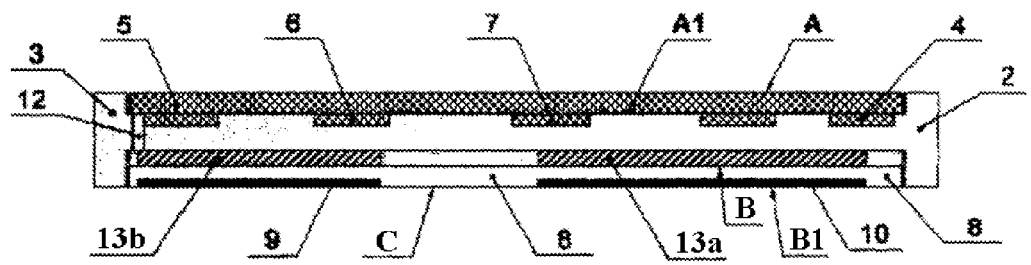
FIG. 2c shows SPI unit, which is also an assembly of two assemble units (AU). One of the assembly units comprises logic board, specifically a multichip module, the other assembly unit comprises communication board and magnetic core (batch of magnetic cores). The assembly unit is mounted so that microelectronic units and radio components are oriented towards the space between stiffener ribs of the base. Coils of the communication board, provided on the second assembly unit are placed adjacently to the casing (not shown).
Figure 2D:
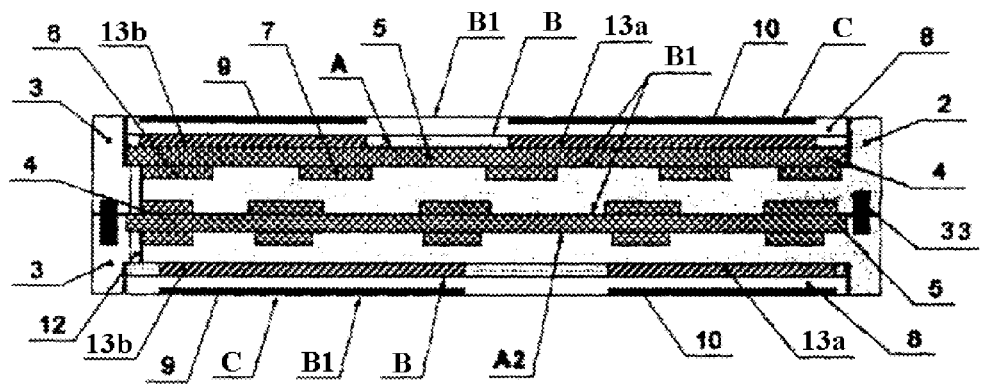
FIG. 2d shows SPI unit, which is an assembly of three assemble units (AU), mounted on two parts of the composite base. One assembly unit comprises a communication board, a logic board and a magnetic core (batch of magnetic cores), provided between the communication board and the logic board. The other assembly unit is a second logic boars or multichip module, where the placement of assembly components is enabled on both sides. Both said assembly units are mounted on one part of the base on both sides of its surface, so that board assembly components are oriented towards the space between stiffener ribs. Communication coils of assembly units are placed adjacently to the SPI unit protective casing. The third assembly unit comprises a magnetic core (batch of magnetic cores) and a communication board placed adjacently to the protective casing (not shown) on the surface of the second part of the base where no stiffener ribs are provided.
Figure 2E:
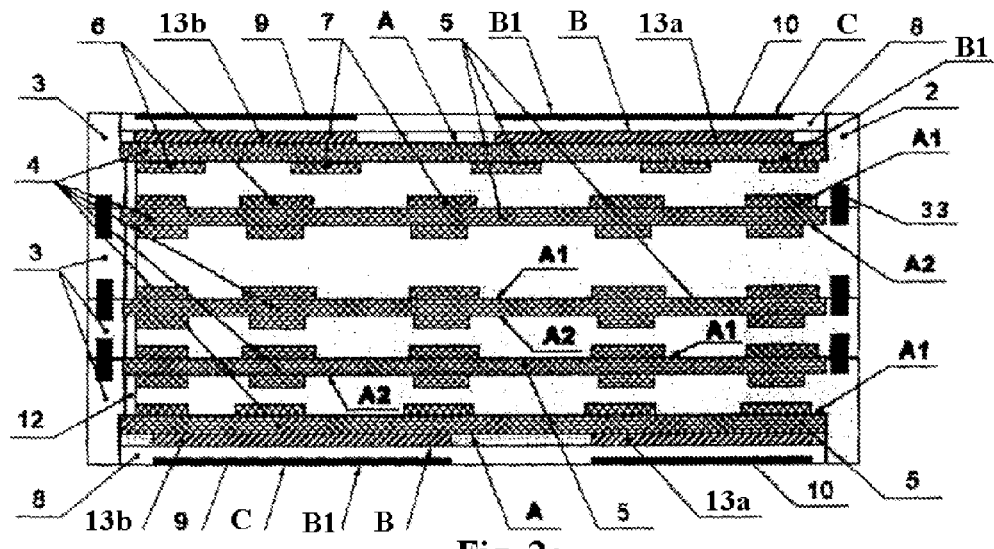
FIG. 2e shows SPI unit, which is an assembly of five assembly units (AU), mounted on four parts of the composite base. One assembly unit comprises communication board, logic board and a magnetic core (batch of magnetic cores), provided between the communication board and the logic board. The second, third and fourth assembly units are logic boards or multichip modules where the placement of assembly components is enabled on both sides. Two assembly units are mounted on one part of the base on both sides of its surface, so that board assembly components are oriented towards the space between stiffener ribs. Communication coils of the first assembly unit are placed adjacently to the SPI unit protective casing. The third and fourth assembly units are mounted on the second and third parts of the base respectively, so that assembly components of assembly unit are oriented towards the space between stiffener ribs of the bases. The fifth assembly unit comprises a magnetic core (batch of magnetic cores) and a communication board. The fifth assembly unit is placed adjacently to the protective casing (not shown) on the surface of the fourth part of the build-part base where no stiffener ribs are provided.

The SPI device is implemented as follows.

The SPI device comprises a protective casing (1) of a unit (2) for storing and processing information (an SPI unit) comprising a base (3), a logic board (4) provided with a switching board (5) having switching layers, the switching layers including surface layers « A » (no components are provided) and mounting layers « A1, A2 » (components are provided), wherein microelectronic units (6), semiconductor devices and other radio components (7) combined into an electrical circuit are mounted on « A1 » layers. Furthermore, the SPI unit comprises a communication board (8) provided with switching layers comprising windings of communication coils (9, 10), wherein the communication board comprises two switching surface layers « B and B1 « , and outer windings of communication coils (9, 10) are provided on the surface switching layer » B1 » . Communication coils (9, 10) of the communication boards (8) are secondary coils of a planar transformer, the planar transformer being formed when the SPI device is installed in the device for reading and/or writing. At least one communication coil is a power supply channel communication coil (9), while the other coils are information channel communication coils (10). Communication boards (8) are provided in the SPI unit (2) so that their surface switching layers « B1 » having outer windings of communication coils (9, 10) are outer sides of the SPI unit (2) working plane « C » . Communication coils (9, 10), the logic board (4) and magnetic cores (13*a* and 13*b*) are combined with electrical coupling components (12) into the electrical circuit of the SPI unit (2). The protective casing (1) has "n" data exchange working planes << C>> which where "n" corresponds to the number of the communications boards (8). All conductive elements are conductors (14, not shown) of the communication board (8) surface switching layer « B » are isolated electrically from the base (3), and communication board (8) surface switching layers « B » are electrically isolated from magnetic cores (13*a* and 13*b*), and surface switching layers « B1 » are electrically isolated from the protective casing (1). Conductive elements (coil windings—14, not shown) of the communication coils (9, 10) for each of the communication boards (8) are connected both with electrical circuit elements of the logic board (2) and the magnetic cores (13*a*, 13*b*) by means of electrical coupling components (12).

The SPI unit (2) is provided in the protective casing (1), wherein the SPI unit comprises at least one logic board (4) which is a multichip module for storing and processing information, the multichip module comprising a switching board having at least one switching layer, wherein surface assembly elements (MU, SCD, REC) are placed on the surface « A1 » of the at least one switching layer and connected by conductive elements, such as conductors (15, not shown), according to a schematic circuit of the logic board (4), the schematic circuit being a part of the common SPI unit diagram;

at least one communication board (8) comprising receiving/transmitting coils (9, 10), specifically power supply channel communication coil (9) and information channel communication coil (10), planar transformers which can be formed by coaxial positioning "primary" receiving/transmitting coils (9, 10) of an external device (11) for reading/writing on the "secondary" SPI unit coils; and magnetic cores (13*a*, 13*b*) produced from a magnetic material, the magnetic cores providing desired parameters of planar transformers air clearance « h » ($\mu >> \mu eq. > \mu 0$);

electrical coupling components (12), e.g. flexible loops (cables, plug wires, and connectors) which electrically connect the power supply channel coils (9) and information channel communication coils (10) of the communication boards (8) with the magnetic cores (13*a*, 13*b*) and logic boards (4); and the base (3) comprises stiffener ribs (16), wherein space between a base (3) surface, surface assembly elements (6, 7) and « A1 » layer of the logic board (4) is filled with heat-conductive damping dielectric material (17).

Figure 6:
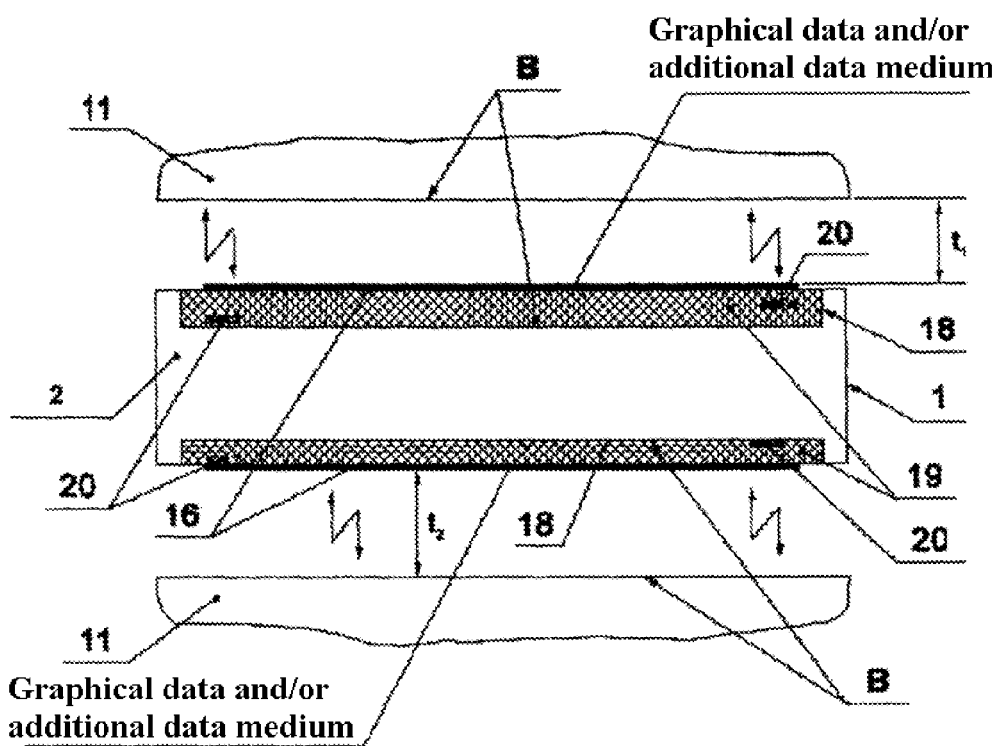
FIG. 6 is an explanatory diagram illustrating inserts and microchips within grooves.

The sealed protective casing (1) is electrically isolated from the switching elements of the communication board (8) surface B1 and switching elements of the logic board surface « A », and the base (3) of the SPI unit (2) is electrically isolated from switching elements of the surface A1 comprising logic board (4) surface assembly elements (6, 7) and from magnetic cores (13*a*, 13*b*). The magnetic cores (13*b*) corresponding to the power supply channel communication coils (9) are electrically isolated from magnetic cores (13*a*) corresponding to the information channel communication coils (10), and apertures or grooves can be made in the base (3) for passing loops (wire plugs) (12) from communication board (8) to the multichip module (4) board. The protective sealed casing (1) can comprise at least one recess (18) (see FIG. 6) for receiving at least one insert (label) (19) produced from a dielectric material, wherein the dielectric material can bear at least the following information data:

graphical information (text, photo, drawing, barcode, holographic image, holographic label, steganographic (formed from steganography, which is an art of cipher), stereogram or other).

single magnetic data medium, such as a tape of magnetic material, a mark of ferromagnetic amorphous alloy, magnetic marker or magnetic label;

single optical data medium, specifically at least an optical layer;

data medium in the form of a multilayer structure having alphanumeric data from thin-layer material;

data mediums of other types, which can be mounted on the insert (19) surface and/or on the material of the casing front side;

single integrated circuit (20) chip, e.g. a microchip of « Memory-Spot» type (RFID and other) comprising solid-state electronic memory units, microprocessor, modem and other units, and at least one antenna to perform data exchange with reading device through a high-frequency radio channel.

Base (3) can comprise a recess (22) (see FIG. 7), wherein a surface of the recess is protected by an electroisolating material (23), and a microcasing (24) of a material having non-magnetic metal properties and thickness of 0<t<1 mm is positioned in the recess (22). The microcasing (24) can have vacuum-tight conductive connection with a material of the protective casing (1), and the inner surface of the microcasing (24) is electrically isolated with dielectric material (25) having an aperture (26) in a contact surface (27) part of the microcasing (24), wherein an identification chip (28) is placed in the microcasing (24), the identification chip having an electrical connection (29) with the contact surface (27) of the microcasing (24) through a bus "ground/common/casing", or through a "data line", the chip (28) is closed by a cover (30) produced from a material having properties of a non-magnetic metal, the cover provided with a contact member (a contact surface) (31), for electrical connection (32) with the chip (32) through the "data line" or the bus "ground/common/casing" free space in the microcasing is filled with a dielectric heat-conductive damping material (17), the cover (30) is isolated from the microcasing (24). The composite base is joined by a fastening (33).

The technical result is achieved due to the unit (2) for storing and processing information (SPI unit) is installed in the protective casing (1) of material having non-magnetic metal properties and thickness of 0<t<1 mm, wherein the casing is sealed by conductive vacuum-tight seam of the coupled casing parts when the SPI unit is installed in the protective casing, wherein the SPI unit (2) comprises at least:

one logic board which, specifically a multichip module (4) comprising a switching board (5) (printed board, optical board, solid state board etc.) and frameless (provided with microcasing) active (microelectronic units: transmitter/receiver, memory, microprocessor, other IC, semiconductor devices) and passive radio (R, C, L and other) elements (6 and 7 respectively) that are connected by means of a conductor layout in the switching layers of the switching board (5) according to the schematic circuit;

one communication board (8) comprising receiving/transmitting coils (9, 10) produced by circuit printed method (combined method or other method) and magnetic cores (13a, 13b) of magnetic material (material properties corresponds to selected circuit design and signal receiving/transmitting frequencies) that provide an increased coupling coefficient due to increasing a magnetic permeability ($\mu \gg \mu eq. > \mu 0$) in the air clearance «h» of the planar transformer which can be formed by coaxial positioning "primary" receive/transmit coils (9, 10) of external device (11) for reading/writing on the "secondary" SPI unit coils. In addition, communication boards (8) are electrically connected with both magnetic cores (13a, 13b) and switching board (5) of the module through loops (cables, plug wires, and connectors) (12), when required, by apertures in the base (3) and their coils (9) are faced outwards from the base (3);

one base (3) of a material having heat-conductive metal alloy properties, the base being provided with stiffener ribs, wherein a space between the base (3), switching board (5), logic board (4) and radio components (6, 7) of the logic board can be filled with dielectric material (17) having high heat conductivity and damping properties, and every of the magnetic cores (13a, 13b), switching elements and radio components of the logic boards (4) and communication boards are electrically isolated from a conductive material of the base (3) and protective casing (1) by dielectric materials (coatings).

The protective casing (1) can comprise a recess (18) of h≥0.15 mm on at least one surface, the recess receiving an insert (19) produced from a dielectric material.

The device operates as follows.

When the SPI device is installed in the device (11) for reading/writing, the SPI unit coils of communication boards (8) having power supply channel coils (9) and information channel coils (10) enclosed by a protective casing are coaxially overlapped by corresponding coils (9, 10) on communication boards of the device (11) for reading/writing, wherein the device (11) forms in such manner a planar transformer.

Therewith, magnetic cores (13a, 13b) provided in the plane parallel to the SPI unit (2) communication boards (8) coils and the external device prevent the magnetic field from propagating out of their bounds and increase the magnetic permeability value allowing therefore more complete energy usage by the secondary coils (9, 10) of the SPI unit (2) when electrical power is supplied to the primary coils (9, 10) of the external device (11), and provide calculated parameters of a mutual induction vector oriented normally in relation to the communication coils (9, 10) and significantly increased coupling coefficient for coupling with the SPI unit (2) secondary coils (9, 10), and allow to create a electrical power, the electrical power being required for a reliable electromagnetic connection through a sealed conductive casing (1) of the SPI device, as a result a basis for stable receiving/transmitting an electrical power and information signals is provided when a load resistance of SPI unit (2) is reduced.

Contactless electrical power transmission channels (F≥10 kHz–2.5 MHz) operate as follows.

Power supply channel primary coils (9) of the planar transformer are loaded from the external device (11) for reading/writing, the external device comprising communication boards (8) having an electrical connection of the coils (9) with the dc/ac converter of the external device (11) converting a dc voltage (U1$dc$) to ac amplitude normalized voltage (U1$ac$) having a frequency F≥10 kHz, wherein a voltage (U2$ac$) of the planar transformer secondary coils (9) is measured through the power supply channel of the communication boards (8), wherein the voltage (U2$ac$) is rectified and normalized according to the load power supply voltage (U2$dc$) of the logic board (4) electronic circuit. Other methods for energy transmission through a power supply channel are possible, for example a method wherein a voltage pulse converter is used, and the output voltage is normalized by a pulse-width modulation of the pulse voltage supplied to the primary coil (9) of external device (11) communication board (8).

Contactless information transmission channels (F≥10 kHz–2.5 MHz) operate as follows.

Figure 3:
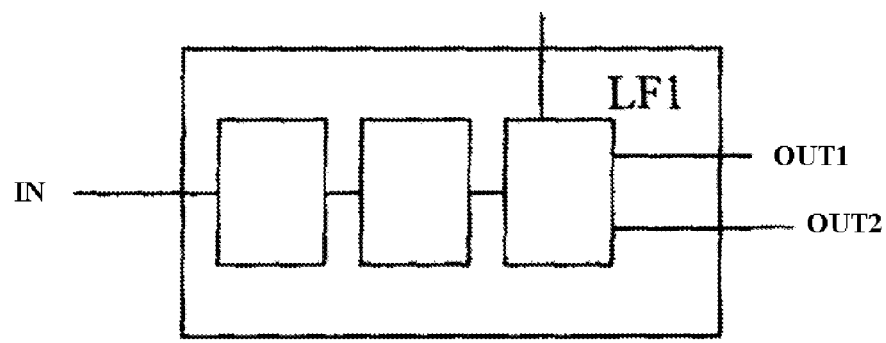
FIG. 3 shows a signal transmitter designed for primary coils load of the planar transformer when communication coils operate through an information channel.
Figure 4:
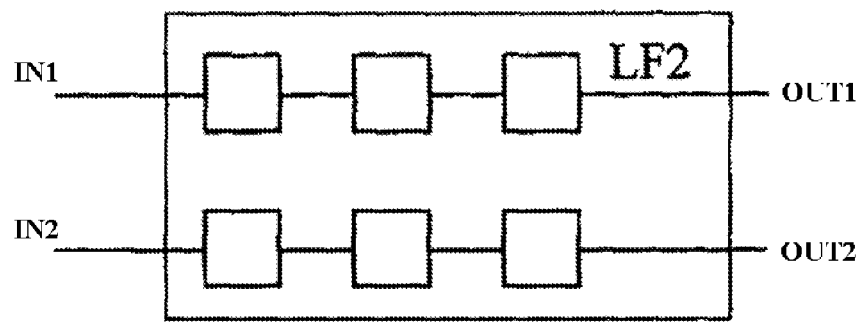
FIG. 4 shows a receiver of information signals when communication coils operate through an information channel.
Figure 5:
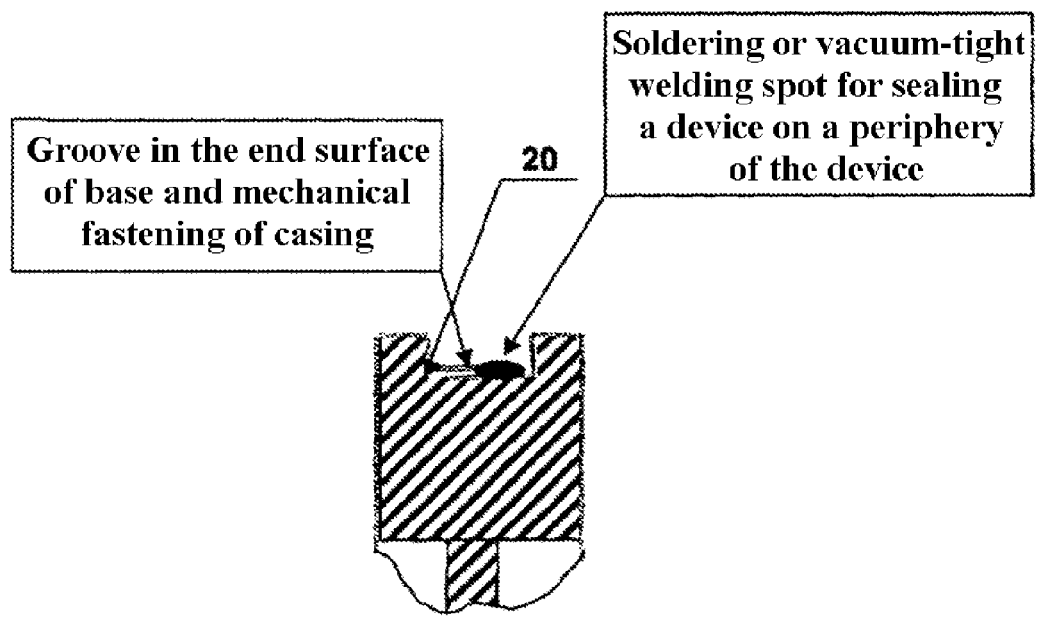
FIG. 5 shows a groove on the base end, an example of mechanical fastening of the casing, soldering or vacuum-tight welding for sealing a casing on periphery.

Information signal transmission channel comprises a signal transmitter (LF1, FIG. 3) within a logic board (4), the signal transmitter being designed for a load of the planar transformer primary coils (10) (communication boards (8) of the external device (11)) and a receiver (LF2, FIG. 4) for receiving information signals. Outlet ends of the transformer (communication board (8) of the SPI unit (2)) receiving coils (10) are connected with inputs of the receiver LF2, similarly outlet ends of the planar transformer (communication board (8) of the SPI unit (2)) transmitting coils (10) are connected with outputs of the transmitter LF1.

When the logical pulse is formed in an input of the transmitter LF1, the power supply voltage (E) is applied to the transformer (communication board (8)) coil (10), wherein a current flowing in the coil is transformed to the secondary winding of the coil (10) (communication board (8)). When the logical pulse ends, the energy returns to the power supply source. In addition, a power supply voltage (E1≠E) is formed on the coil (10) (communication board 8). The similar information signal transmission channel is provided in the external device, for example in the device (11) for reading/writing.

The number of power supply channels and information signal channels depends on the number of power supply channel coils (9) and information channel coils (10), respectively, wherein said channels receive and/or transmit information when the SPI device working planes «C» are positioned at a distance of a manufacturing clearance (t≥0) from corresponding planes «C» of the external device (11) for reading/writing when supplying electrical power energy and information signals from the external device (11) for reading/writing, and information signals are transformed particularly with original logical LSI controllers, LSI controllers and/or LSI microprocessors (6) that are incorporated in logic board (4) circuit and provide writing (collecting and reading) information into the electronic memory units (6) and, when required, provide reprogramming according to programs in the unit (2). Contactless remote channels in the high-frequency range (F≥1 GHz) operate as follows.

Data are remotely written on and read from a chip (of Memory spot type) of a microchip (20), which does not comprise power supply elements and which is provided within the insert (19) of the SPI device, by radio communication from the reading device (11) comprising a reader for reading signals of the chip 20 at a distance of t1 (t2) (See FIG. 7), wherein the distance can be ≥1 m, while an exchange speed can be ≥10 Mbit/s, and radio signal frequency can be F≥2.45 GHz, and energy for radio communication and microchip data processing are supplied from the reading device (11) with electromagnetic induction, wherein the data exchange between the chip (20) and the reader (11) can be performed through a data communication protocol which can have a certain encrypting standard, for example an algorithm of SHA-1 type. When the SPI device is installed in the external device for reading/writing, the external device comprising a device (reader) for reading information from the chip (20), an data exchange between the chip (20) and the SPI unit (2) can be performed according to the specific program.

Operation in the bi-directional mode when the SPI device galvanically contacts the reading device is as follows.

Reading/writing information of the identification chip (28) provided in the recess of the base (3) material of SPI unit (2), including a request for unique code, response to the request, updating the code and other information of the chip (28), is performed when the SPI device is installed into the integrated device (11) for reading/writing in the bi-directional information exchange mode and when the SPI device casing (1) connected through the bus (29) "ground/common/casing" with the microcasing (24) and identification chip (28) circuit electrically contacts with the casing of the integrated reading device (11) connected with the bus "ground/common/casing" of the integrated reader for reading data of the chip (28), and when the cover (30) isolated from the SPI device casing (1) and having an electrical connection with the identification chip (28) through an "information line" (32) electrically contacts through a "data line" with the data reader integrated to the device for reading/writing. A solid-state circuit of the identification chip (28) comprises a single-wire port, control logic and a memory device, wherein the memory device can be in the form of a read-only memory, writable memory or nonvolatile memory, and the chip circuit can further comprise a cryptographic microprocessor, timer, and sensors. When the SPI device provided with an identification chip (28) having a programmable nonvolatile memory device is installed into the external device (11) for reading/writing provided with a reader for reading the chip (28) data, data are exchanged between the chip (28) and the SPI unit (2). Alternatively, the identification chip (28) can be connected through a bus (29) "ground/common/casing" to the microcasing cover (30) and through "data line" to the SPI device protective casing (1).

Thus are improved the following performance characteristics of the device:
- extended frequency range of radio communication from F≥10 kHz to 2 and more;
- extended distance range of the SPI device radio communication with the reader;
- expanded applicability of the SPI device;
- increased general reliability and resistance of the SPI device in response to critical values of environmental contribution factors and their combinations;
- increased level of data protection from environmental contribution factors and unauthorized access;
- decreased metal consumption, dimensions and mass of the device;
- increased processability index.

The technical result is achieved by use of contactless technology of receiving and/or transmitting electrical power and data signals from the external device for reading/writing to/from the electrically closed data medium
- by means of a portable sealed device for storing and processing data, by introducing an additional graphical information on the surface of the SPI device casing and/or insert, and by installing additional external data mediums of SPI device, the external data mediums being implemented as microchips mounted within the insert, and by means of identification chips in an electrically isolated microcasing mounted in the base material, that together with the integrated external device for reading/writing allow to increase a reliability level for identification and authentication of users and devices and provide application the SPI device in the wide field of data technologies and telecommunications, specifically in the development of the following systems:
- control systems, security systems, registration systems, access systems, data protection systems for special, industrial and private facilities (safes, vehicles, such as cars, planes, and etc.);
- systems for protected electronic backup of documentation and copyrighted works, including audio and video works and software;
- systems for acquiring, processing and controlling data in facilities characterized by critical values of environmental contribution factors (excessive humidity, slightly aggressive liquid, excessive fire and explosion risks, excessive amount of electromagnetic radiation, excessive suspended material concentration etc.);
- identification systems for identification of objects and subjects, passportization systems for passportization of real estate, vehicles and citizens.
- systems for medical services and personal health monitoring;
- banking information technologies;
- emergency communication systems for establishing a communication between underwater-based or space-based sealed objects;
- courier communication systems in the file mode;
- social and payment systems, and search systems.

Mobile devices for storing and processing data (SPI devices) can be used:
- as a protected removable nonvolatile writable memory for the following devices:

for stationary PCs and portable computing systems;
for portable computing devices (laptops and other devices);
for mobile devices (PPC, smartphones, PDAs, navigation devices, digital audio and/or video devices);
as a fiscal memory for cash register machines, electronic systems for determining of vehicle weight, household electronic weights, gambling machines, custom and border control systems for controlling and inspection, combination locks;
as a data medium protected against unauthorized access for storing and replication of copyrighted works, such as literary works, audio and video works and software;
as a data medium for converting data of library holdings to an electronic format;
as credit cards for private use, social, payment and credit cards that comprise quick remote access operating data and data having increased security level against unauthorized access;
as a controlling device for industrial and robotic devices.

Thus, the device allows to:

1. Expand application of the SPI device by effectively using the working planes of SPI device and placing at least one label allowing having additional data and additional data mediums on its surface:
   graphical information (text, photo, drawing, barcode, holographic image, holographic label, steganogram, stereogram or other);
   magnetic data medium, such as tape produced from a magnetic material, mark produced from a ferromagnetic amorphous alloy, magnetic marker or label;
   optical data medium having at least an optical layer;
   data medium having a multilayer structure with graphical and character data, the multilayer structure being produced from a thin-layer material;
   other data medium types which can be placed on the insert surface and/or material of the casing front side;
   an integrated circuit chip allowing data exchange with reading device through a high-frequency radio channel.

2. Increase quality of user identification and authentication and data protection level for SPI device by means of special identification chips providing data exchange with the SPI unit when the SPI device is installed into the integrated external device.

3. Expand frequency range (from 10 kHz to several GHz) of radio communication between the SPI device and external device for reading/writing by placing additional communication coils on SPI unit end surfaces.

4. Expand distance range for data readout.

5. Divide data stored in the SPI device into short-term remotely accessible data and data requiring a certain level of protection against the unauthorized access.

6. Increase reliability and security level of data in stationary and portable computing systems and digital devices, and corporate computer networks by applying the SPI device as an integrated and removable memory device.

7. Increase a resistance to viruses for systems using SPI devices.

8. Improve device performance characteristics, such as operating speed, resistance to mechanical loads and humidity, resistance to electromagnetic radiation, to provide operability in case of wet and dirty adjacent plane of the external device, and improve mass-dimensional properties.

9. Improve reliability characteristics of the SPI device operation: probability of failure-free operation P in the period of time t, mean time between failures (MTBF), probability of reading errors) and endurance by increasing the resistance to environmental contribution factors (electromagnetic radiation, mechanical loads, humidity, and etc.).

10. To provide the multisystem application of the SPI device.

11. Improve integrity of the SPI device.

12. Increase processability index of the single construction elements and SPI device as a whole.

13. Decrease metal consumption of the device.

The SPI device application is the most perspective as mobile, protected from environmental contribution factors and unauthorized access solid-state data mediums, integrated in various automated control systems, data protection systems, access systems, object identification systems, and other automated systems, and as a changeable memory device for stationary, portable and mobile devices of digital and computing equipment, or a control software medium for automated industrial and robotic equipment.

We claim:

1. A device for storing and processing information the device comprising:
   a sealed protective casing produced from a conductive non-magnetic material; and
   a unit for storing and processing information the unit comprising:
   a base,
   a logic board having a microelectronic units and radio components which are combined into an electric circuit,
   communication boards having communication coils installed in the unit for storing and processing information on outer sides of working planes,
   magnetic cores and electrical coupling components which are combined into an electrical circuit of the stand-alone unit for storing and processing information;
   wherein the protective casing has "n" data exchange working planes where "n" corresponds to the number of communications boards;
   the unit for storing and processing information comprises:
   at least one logic board and at least one communication board each having communication coils being secondary coils of a planar transformer formed when the device for storing and processing information is installed into a device for reading/writing,
   wherein at least one of the communication coils is a power supply channel communication coil, while the other of the communication coils are information channel communication coils,
   wherein power and information channel communication coils are mounted on each board;
   wherein the power supply channel communication coil and information communication coils are mounted on input/output contact members of the communication coils of each of the communication boards are connected with the electrical circuit components of the logic board by means of the electrical coupling components;
   one magnetic core is produced from a thin-layer magnetic conducting material,
   wherein switching layers of the logic board are electrically isolated from material of the base and from the magnetic core, while the microelectronic units and the radio components are installed on the logic board on the base side,
   wherein the base is produced from a heat conductive metal alloy;
   wherein the electrical coupling components combine the electrical circuit of the logical board, the electrical circuits of the communication boards, and the magnetic cores into a general electrical circuit of the unit for storing and processing information.

2. The device according to claim 1, characterized in that the protective casing further has at least one recess in the working plane, wherein an insert produced from a dielectric material is installed in a plane of the at least one recess.

3. The device according to claim 2, characterized in that the inset front side has a graphic information, and/or optical carrier, and/or magnetic carrier, and/or another information carrier compatible with dielectric plane of the insert, and/or with the material of the casing.

4. The device according to claim 2, characterized in that inserts in thea volume comprise at least one microchip having active and passive radio components and an antenna.

5. The device according to claim 1, characterized in that the magnetic core is divided into at least two magnetic cores installed adjacent and in parallel to the switching layers of the communication boards and corresponding communication coils.

6. The device according to claim 1, characterized in that the unit for storing and processing information further comprises a common bus, the common bus being electrically connected with the magnetic core.

7. The device according to claim 1, characterized in that the unit for storing and processing information further comprises at least two logic boards.

8. The device according to claim 1, characterized in that the microelectronic units and semiconductor devices are selectively provided with heat sinks.

9. The device according to claim 1, characterized in that a space between the logic board components and base is filled with a heat conductive damping dielectrical material.

10. The device according to claim 1, characterized in that the base is provided with at least one groove along the periphery of an end surface.

11. The device according to claim 1, characterized in that the base has at least one recess for bean identification chip.

12. The device of claim 11, characterized in that at least one identification chip is installed into the at least one recess, the at least one identification chip comprising a single-wire port, a logical control unit and a storage device.

13. The device of claim 1 characterized in that the base is composite.

14. The device of claim 1, characterized in that the device for storing and processing information further comprises at least one component defining a working position of said device for storing and processing information in the device for reading/writing.

* * * * *